(12) United States Patent
Soika et al.

(10) Patent No.: US 8,588,877 B2
(45) Date of Patent: Nov. 19, 2013

(54) ARRANGEMENT HAVING A SUPERCONDUCTIVE CABLE

(75) Inventors: Rainer Soika, Hannover (DE); Mark Stemmle, Hannover (DE)

(73) Assignee: Nexans, Paris (FR)

( * ) Notice: Subject to any disclaimer, the term of this patent is extended or adjusted under 35 U.S.C. 154(b) by 411 days.

(21) Appl. No.: 12/610,643

(22) Filed: Nov. 2, 2009

(65) Prior Publication Data

US 2010/0279874 A1 Nov. 4, 2010

(30) Foreign Application Priority Data

Nov. 24, 2008 (EP) .................................... 08291104

(51) Int. Cl.
*H01L 39/24* (2006.01)
(52) U.S. Cl.
USPC ............................................................ 505/230
(58) Field of Classification Search
USPC ........................................................ 505/230
See application file for complete search history.

(56) References Cited

U.S. PATENT DOCUMENTS

| | | | | |
|---|---|---|---|---|
| 4,966,142 A | * | 10/1990 | Zimmerman et al. | 228/262.9 |
| 5,029,256 A | * | 7/1991 | Tokita et al. | 313/407 |
| 6,448,501 B1 | * | 9/2002 | McIntyre et al. | 174/125.1 |
| 2006/0211579 A1 | * | 9/2006 | Yamaguchi | 505/230 |
| 2008/0083546 A1 | * | 4/2008 | Allais et al. | 174/15.5 |

* cited by examiner

*Primary Examiner* — Paul Wartalowicz
(74) *Attorney, Agent, or Firm* — Sofer & Haroun, LLP

(57) ABSTRACT

An arrangement is provided having a superconductive cable (SK) which consists of a superconductive conductor (1) and a superconductive screen (3) that encloses the latter with the interposition of a dielectric (2) and which is enclosed, with the inclusion of a free space (FR) for conveying a refrigerant, by a cryostat (KR) which consists of two metal tubes (4,5) arranged mutually concentrically, between which vacuum insulation (6) is arranged. Outside the screen (3), a tubularly closed layer (7, 8) of a ferromagnetic material is provided over the entire length of the cable (SK). It is preferably arranged on the outer circumference of the cryostat (KR).

1 Claim, 1 Drawing Sheet

ARRANGEMENT HAVING A SUPERCONDUCTIVE CABLE

RELATED APPLICATION

This application claims the benefit of priority from European Patent Application No. 08291104.1, filed on Nov. 24, 2008, the entirety of which is incorporated by reference.

BACKGROUND

1. Field of the Invention

The invention relates to an arrangement having a superconductive cable which consists of a superconductive conductor and a superconductive screen that encloses the latter with the interposition of a dielectric and which is enclosed, with the inclusion of a free space for conveying a refrigerant, by a cryostat which consists of two metal tubes arranged mutually concentrically, between which vacuum insulation is arranged (WO 03/052775 A1).

2. Description of Related Art

A superconductive cable in modern technology has electrical conductors made of a composite material, which contains a ceramic material that enters the superconducting state at sufficiently low temperatures. With sufficient cooling, the electrical DC resistance of a correspondingly constructed conductor is zero so long as a particular current strength is not exceeded. Suitable ceramic materials are for example YBCO (yttrium-barium-copper oxide) or BiSCCO (bismuth-strontium-calcium-copper oxide). Sufficiently low temperatures to bring such a material into the superconductive state lie, for example, between 67 K and 110 K. Suitable refrigerants are for example nitrogen, helium, neon and hydrogen or mixtures of these substances.

In the arrangement according to WO 03/052775 A1, which was mentioned in the introduction, a superconductive cable with a cold dielectric is used. It consists of an inner conductor applied onto a tubular carrier, and a screen arranged concentrically therewith, which are mutually separated and kept at a distance from one another by the dielectric (insulation). The conductor and the screen consist for example of bands of superconductive material, such as YBCO or BiSCCO, which are wound with a long pitch around a support while lying tightly together. This known superconductive cable is constructed so that the superconductive screen externally screens the magnetic field of the superconductive conductor during unperturbed operation. In the event of a short-circuit, the screen changes its impedance so that the magnetic field of the conductor is no longer fully screened. Not only can such a short-circuit therefore lead to destruction of the cable (burn-out), but electromagnetic perturbations can also occur outside the cryostat.

OBJECTS AND SUMMARY

It is an object of the invention to configure the arrangement described in the introduction so that the effects of a short-circuit can be substantially reduced, while at the same time only very minor electromagnetic perturbations occur outside the cryostat.

This object is achieved according to the invention in that a tubularly closed layer of a ferromagnetic material is provided outside the screen over the entire length of the cable.

Ferromagnetic materials in the context of the invention are all materials which have a relative permeability $\mu_r$ of more than 10. In the event of a short-circuit, the screen of the cable substantially loses its screening function. The layer of ferromagnetic material arranged outside it therefore enters the magnetic field generated by the conductor of the cable and directly causes a substantial increase in the inductance of the conductor, i.e. an increase in its electrical impedance. The short-circuit current flowing through the conductor is therefore limited significantly and rapidly. The heating, which occurs in known cables owing to a strong short-circuit current, is correspondingly reduced. The effect of limiting other short-circuit current is further increased by the remagnetization losses which occur in the layer of ferromagnetic material, when the superconductive cable is an AC cable. The ferromagnetic material furthermore screens the magnetic field of the conductor of the cable externally. Scarcely any electromagnetic perturbations can therefore occur for apparatus located outside the cryostat. Furthermore, forces acting on the cable phases in the vicinity are reduced.

In a preferred embodiment, the layer of ferromagnetic material is arranged on the outer circumference of the cryostat. Advantageously, the outer-lying tube of the cryostat may itself consist of the ferromagnetic material. A material with a high relative permeability $\mu_r$ is preferably used as the ferromagnetic material. It is possible to use either a material with high hysteresis losses or a material with low hysteresis losses, depending on the desired cable response in the event of a short-circuit. Like all metallic materials, the layer of ferromagnetic material is also electrically conductive. It can therefore be heated by magnetic hysteresis and eddy currents under the effect of an AC magnetic field which may emerge from the conductor of the cable. In the preferred embodiment of the arrangement, however, this heating takes place outside the cryostat so that the cable itself and the refrigerant are not heated by it. Because of the consequent low heating, the recooling times are reduced so that the cable is ready for use again more rapidly. The low heating also means less mechanical stress of the various components of the arrangement. Finally, the refrigerant also remains unaffected by the heating of the ferromagnetic layer. Since only a small refrigerating power is furthermore required owing to the reduced short-circuit current, the layout of the cooling system can also be simplified in this preferred embodiment of the arrangement.

If a material with very low hysteresis losses is used for the layer of ferromagnetic material, then the layer will be heated only insubstantially by an AC field which may be generated by the conductor of the cable. Such a material advantageously has a high relative permeability $\mu_r$. In the case of such a material, in particular, the layer of ferromagnetic material may also be arranged inside the cryostat. For example, it may then directly enclose the screen of the cable. In this embodiment of the cable, the inner tube of the cryostat may also consist of the ferromagnetic material.

BRIEF DESCRIPTION OF DRAWINGS

Exemplary embodiments of the subject-matter of the invention are represented in the drawings.

DETAILED DESCRIPTION

Figure 1:
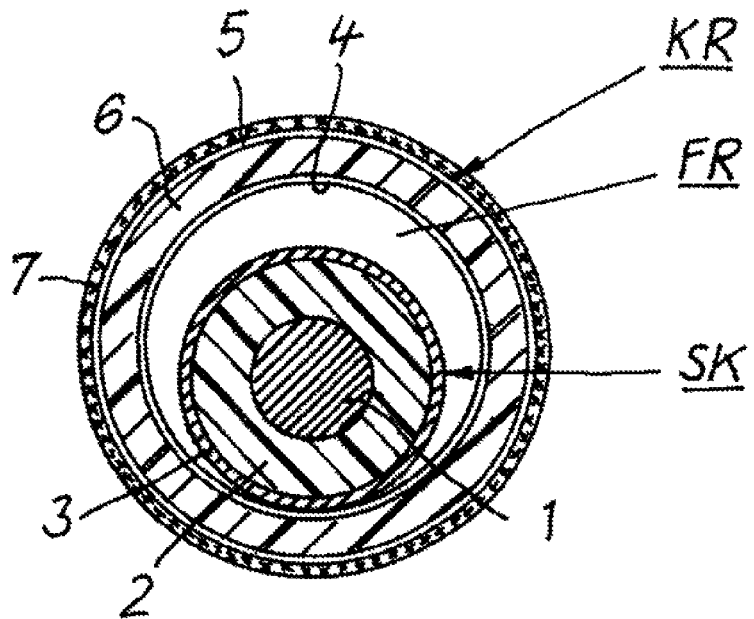
FIGS. 1 and 2 show two differently constructed arrangements according to the invention in a schematic representation.
Figure 2:
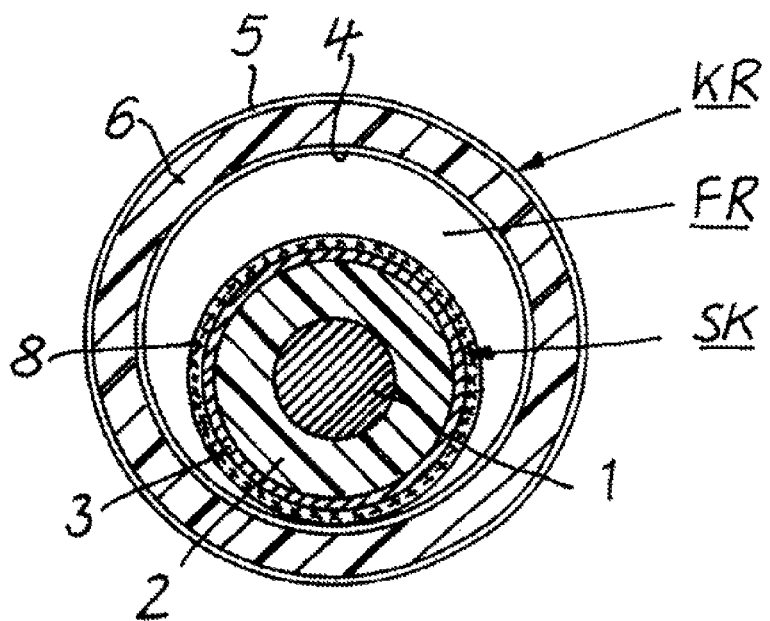

According to FIGS. 1 and 2, the arrangement consists of a superconductive cable SK and a cryostat KR enclosing the latter. The cryostat KR furthermore encloses a free space FR through which a refrigerant, for example nitrogen, is fed during operation of the arrangement.

The superconductive cable SK consists of a superconductive conductor 1, a dielectric 2 which encloses the latter and acts as insulation, and a superconductive screen 3 arranged over the dielectric 2.

The cryostat KR is constructed from two metal tubes 4 and 5 arranged mutually concentrically, which preferably consist of steel and may be corrugated transversely to their longitudinal direction in order to improve the flexibility of the cryostat KR. Vacuum insulation 6 is applied by known technology between the inner tube 4 and the outer tube 5 of the cryostat KR.

According to FIG. 1, a tubularly closed layer 7 of ferromagnetic material is applied over the outer tube 5 of the cryostat KR. It is provided over the entire length of the arrangement and encloses the tube 5 all around on its circumference. The layer 7 is thus a tubularly closed shell. It has the following function in the arrangement:

In the event of a short-circuit, the screen 3 of the cable SK substantially loses its screening function. The ferromagnetic layer 7 arranged outside it therefore enters the magnetic field generated by the conductor 1 of the cable SK and directly causes a substantial increase in the inductance of the conductor 1, i.e. an increase in its electrical impedance. The short-circuit current flowing through the conductor 1 is therefore limited significantly and rapidly. The heating of the cable SK and its environment, generated by the short-circuit current, is thus kept relatively low so that the energy expenditure for recooling the arrangement after eliminating the short-circuit is relatively low. The ferromagnetic layer 7 furthermore screens the magnetic field of the conductor 1 externally. Electromagnetic perturbations cannot therefore occur for apparatus located outside the cryostat KR.

If the superconductive cable SK is an AC cable, then the effect of limiting the short-circuit current can be further increased by remagnetization losses which may occur in the ferromagnetic layer.

The layer 7 may be constructed from a band of ferromagnetic material, for example Magneperm, which is wound with overlapping edges around the tube 5. This material has a relative permeability $\mu_r$=450,000 at 50 Hz. The layer 7 could also be produced from a longitudinally running band of such a material, which encloses the tube 5 all around with an overlap point extending in the longitudinal direction.

The thickness of the layer of ferromagnetic material is advantageously more than 0.1 mm. The relative permeability pr of the ferromagnetic materials is more than 10.

Ferromagnetic materials are generally distinguished by a high relative permeability $\mu_r$. Independently of this, ferromagnetic materials have hysteresis losses which are given by the area enclosed on the B-H diagram. Both quantities depend on the material used. There is no correlation between $\mu_r$ and the hysteresis losses.

Instead of a separate or additional layer 7, in a modified embodiment of the arrangement according to FIG. 1, the actual outer tube 5 of the cryostat KR may also consist of ferromagnetic material, for example a steel with a relative permeability $\mu_r$=1000 at 50 Hz. Alloys of nickel and iron with further additives in small amounts are also suitable.

What is important is that, in all embodiments, the layer of ferroelectric material is arranged as a layer closed all around outside the superconductive screen 3 so that it lies in the magnetic field of the conductor in the event of a short-circuit. Correspondingly, according to FIG. 2, it may also be arranged inside the cryostat KR and be applied as a layer 8 for example externally on the screen 3. For the layer 8—as already mentioned—a material with very low hysteresis losses is advantageously used so that it is heated only insubstantially in the event of a short-circuit. The layer 8 may then be connected to the same potential as the screen 3. Instead of the separate layer 8—similarly as in FIG. 1—the inner tube 4 of the cryostat KR may also be produced from ferromagnetic material. In this embodiment of the arrangement as well, with ferromagnetic material lying inside the cryostat KR, limitation of the short-circuit current flowing in the conductor 1 occurs as described for the arrangement according to FIG. 1.

The invention claimed is:

1. Arrangement having a superconductive cable comprising:
   a superconductive conductor;
   a dielectric surrounding said superconductive conductor;
   a superconductive screen which surrounds said superconductive conductor and said dielectric;
   a cryostat, formed as an inner metal tube and an outer metal tube arranged concentrically to each other, between which inner and outer metal tubes a vacuum insulation is provided, said cryostat enclosing said superconductive conductor, dielectric and superconductive screen within a free space; and
   a tubularly closed layer of a ferromagnetic material with a high relative permeability of $\mu_r$=450,000 at 50 Hz which is wound with overlapping edges externally onto the outer tube of the cryostat, over the entire length of the cable.

* * * * *